(12) United States Patent
Ortmanns et al.

(10) Patent No.: US 7,151,474 B2
(45) Date of Patent: Dec. 19, 2006

(54) CONTROLLED CURRENT SOURCE; IN PARTICULAR FOR DIGITAL/ANALOGUE CONVERTERS IN CONTINUOUS-TIME SIGMA/DELTA MODULATORS

(75) Inventors: Maurits Ortmanns, Niedernwöhren (DE); Yiannos Manoli, Freiburg (DE); Friedel Gerfers, Duisburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/530,762

(22) PCT Filed: Oct. 7, 2003

(86) PCT No.: PCT/DE03/03321

§ 371 (c)(1),
(2), (4) Date: Sep. 16, 2005

(87) PCT Pub. No.: WO2004/034588

PCT Pub. Date: Apr. 22, 2004

(65) Prior Publication Data

US 2006/0055580 A1    Mar. 16, 2006

(30) Foreign Application Priority Data

Oct. 9, 2002 (DE) ................ 102 47 133

(51) Int. Cl.
    H03M 3/00 (2006.01)
(52) U.S. Cl. .................................. 341/143
(58) Field of Classification Search ........ 341/143, 341/155, 144, 118, 120, 156, 158
    See application file for complete search history.

(56) References Cited

U.S. PATENT DOCUMENTS

| | | | |
|---|---|---|---|
| 4,509,037 A | 4/1985 | Harris | |
| 4,737,702 A | 4/1988 | Koenck | |
| 4,998,109 A | 3/1991 | Lechevalier | |
| 5,227,795 A | 7/1993 | Nishikawa et al. | |
| 6,507,301 B1* | 1/2003 | Locher | 341/143 |
| 2002/0011945 A1 | 1/2002 | Locher | |
| 2005/0093725 A1* | 5/2005 | McDaniel et al. | 341/143 |
| 2005/0206543 A1* | 9/2005 | Draxelmayr | 341/143 |

OTHER PUBLICATIONS

Van Der Zwan, et al., "A 0.2-MW CMOS Sigma Delta Modulator for Speech Coding with 80 DB Dynamic Range," *IEEE Journal of Solid-State Circuits*, IEEE Inc., New York, U.S., vol. 31, No. 12, Dec. 1, 1996 (pp. 1873-1880).

(Continued)

*Primary Examiner*—Brian Young
(74) *Attorney, Agent, or Firm*—Brinks Hofer Gilson & Lione

(57) ABSTRACT

The present invention relates to a controlled current source having a control input, in particular for digital/analogue converters in continuous-time sigma/delta modulators, having a current source (4) with a control input which generates an output current dependent on a control voltage applied to the control input, and having a controller (7) for converting a clock signal into a voltage signal, with the controller (7) being connected to the current source (4) in such a manner that the voltage signal is applied as a control voltage to the control input of the current source (4). The controller is designed to is designed to convert the clock signal into a voltage signal which has within a clock duration a reproducible curve ending with a falling flank. Using the present controlled current source in a digital/analogue converter in a feedback branch of a continuous-time sigma/delta modulator permits realizing a sigma/delta modulator which is essentially insensitive to clock jitter.

16 Claims, 4 Drawing Sheets

OTHER PUBLICATIONS

Lerch et al., "A Monolithic Sigma Delta A/D and D/A Converter with Filter for Broad-Band Speech Coding," *IEEE Journal of Solid-State Circuits,* IEEE Inc., New York, U.S., vol. 26, No. 12, Dec. 1, 1991 (pp. 1920-1926).

WO 00/36750A1, Qualcomm Incorporated, Jun. 22, 2000.

Ortman et al., "Jitter Insensitive Feedback DAC for Continuous-Time Sigma-Delta Modulators," International Conference and Electronics, Circuits and Systems, ICECS 01, 2001, no month given.

Maurits Ortmanns et al., "Clock Jitter Insensitive Continuous-Time ΣΔ Modulators", IEEE, 2001, pp. 1049-1052, no month.

Maurits Ortmanns et al., "Neue Dau-Rückkopplung Für Zeitkontinuierliche ΣΔ Modulatoren", ITG-Tagung, VDI, 2000, pp. 221-226, no month.

* cited by examiner

CONTROLLED CURRENT SOURCE; IN PARTICULAR FOR DIGITAL/ANALOGUE CONVERTERS IN CONTINUOUS-TIME SIGMA/DELTA MODULATORS

This application is a 371 of PCT/DE03/03321 filed Oct. 7, 2003.

TECHNICAL FIELD

The present invention relates to a controlled current source, which generates an output current dependent on a control voltage applied at a control input, the controlled current source having a controller for converting a clock signal into a voltage signal. The controller is connected to the current source in such a manner that the voltage signal is applied to the control input of the current source as a control voltage. Furthermore, the invention relates to a digital/analogue converter with the controlled current source, to a sigma/delta analogue/digital converter having a continuous-time sigma/delta modulator with the digital/analogue converter as well as to a method of operation.

In recent years, new technologies permitted distinctly improving sigma/delta analogue/digital converters as well as their main component, the sigma/delta modulator, with regard to resolution and conversion rates, making it possible to use sigma/delta analogue/digital converters in applications ranging from high resolution audio converters to front end circuits of mobile network systems (GSM,UMTS) and to interfaces in communication and information technologies (DSL, cable). These applications use very high conversion rates, which together with the resampling utilized in these systems require very high system velocities, respectively very high sampling frequencies, which on the other hand make very high demands on the individual components of the sigma/delta modulator.

PRIOR ART

Sigma/delta modulators have hitherto usually been realized time discretely in switched capacitor (SC) technology. This technology possesses good properties regarding component matching, simulateability and other features. The high speed requirements of the new applications, however, make it difficult to realize time-discrete sigma/delta modulators, because, for one, the velocity demands on the SC system components are many times greater than the system velocity itself. Furthermore, the sampling/hold elements (S/H) are always more difficult to realize for high velocities and ultimately meeting the velocity requirements leads to high current consumption, which in many applications, such as use in mobile systems, should be avoided.

For these and other reasons, so-called continuous-time sigma/delta modulators utilizing resistance-capacitance integrators, GmC integrators or the like have been developed. The system components of these circuits are less critical with regard to velocity demands which make them suited for use in new fields of application in communication electronics. On the other hand, continuous-time sigma/delta modulators are much more sensitive to some non-idealities in a daily industrial environment. In this, so-called clock jitter, ie. straggling of the system clock frequency, plays a significant role. These fluctuations are not critical in time-discrete sigma/delta modulators, because there all the signals have assumed their final value before the system cycle switches the next time. In this case, the main source of error is falsified sampling of the input signal (S/H) due to clock jitter. In continuous-time sigma/delta modulators, however, this system cycle switches the feedback signal of the digital/analogue converter (DAC). In this case, straggling switching due to clock jitter results in a straggling feedback error, which can reduce the overall resolution of the system considerably. Depending on resolution realization, etc., the maximum tolerable clock jitter in continuous-time circuits is more than two to three decades less than in a comparable time-discrete circuit.

FIG. 1 shows an example of a continuous-time sigma/delta modulator of the first order. The sigma/delta modulator is formed by an analogue integrator 1, comprising an operation amplifier A and a capacitor C as well as a downstream quantizer 2. After digital/analogue conversion, the digital signal y(n) generated by the quantizer 2 is applied via a feedback branch 3 to the input of integrator 1 on which the input signal û(t) is also applied. The integrator 1 integrates the superimposed signal. The output signal x̂(t) of the integrator 1 is sampled with a given clock frequency $f_S$ and the sampled signal x(n) is digitalized by the quantizer 2. Someone skilled in the art is familiar with the operating manner of such a type sigma/delta modulator. In the example shown in FIG. 1, the digital/analogue converter of the feedback branch 3 is formed by a voltage source $U_{ref}$ whose voltage is switched between two reference values dependent on the clock signal. However, if the clock duration varies due to clock jitter, a voltage pulse of varying length is generated, as shown in the diagram in FIG. 1, which shows the generated voltage signal ŷ(t) dependent on time. $T_s$ indicates the distance between two rising flanks of the clock signal, i.e. the clock duration. The varying length of the generated voltage pulse caused by the clock jitter via which integration occurs in the integrator 1 reduces the overall resolution of the system considerably, because the effect of the clock jitter is very intensive particularly due to the integration.

To alleviate this problem when using continuous-time sigma/delta modulators, for example, in "Neue DAU-Rückkopplung für zeitkontinuierliche SD-Modulatoren, ITG-Tagung, VDI, 2000 or in Clock Jitter Insensitive Continous-Time ΣΔ Modulators", International Conference and Electronics, Circuits and Systems, ICECS 01, M. Ortmann et al propose a digital/analogue converter in the feedback branch in which an additional capacity is utilized. Such a type of embodiment is shown schematically in FIG. 2. The capacity $C_R$ is charged on one of the two feedback reference voltages based on the actual digital feedback value. This capacity is then discharged via an additional resistance $R_R$ on the integrator 1 of the sigma/delta modulator. If the discharge time of the capacity (C*R) is small enough compared to the clock duration, the feedback signal is independent of the variation of the occurring clock duration, as is illustrated in the diagram in FIG. 2, in which for its part the feedback signal ŷ(t) is plotted dependent on time. The clock duration $T_S$ is indicated by the double arrow. The figure shows that the feedback signal ŷ(t) decreases from an initial maximum value within the clock duration to a minimum value. The time of the decrease and the minimum value are selected in such a manner that a variation in the clock duration only minimally influences subsequent integration via this feedback signal. The feedback signal is thus largely independent of the change occurring in clock duration. Such a type technology for reducing clock jitter sensitivity in a continuous-time sigma/delta modulator is also described in WO 00/36750. In this printed publication, the digital/analogue converter is realized in the feedback branch by a capacitor, a resistance, two switches and a dipolar switch which switches between the two reference voltages.

This technology has the advantage over time-discrete realizations of sigma/delta modulators that the required slew rate of the employed amplifiers is distinctly reduced by the introduced resistance $R_R$. On the other hand, however, the used amplifier must have a greater bandwidth than conventional continuous-time modulators do in order to be able to charge the current pulse applied to it by the discharge of the capacitor quickly to the integration capacitor. Not selecting the bandwidth of the amplifier large enough results, on the one hand, in a malfunction which influences the maximum resolution of the modulator and, on the other hand, can also lead to artificial slowing down of the discharge of the capacitor, which for its part can lead to greater jitter sensitivity.

Another drawback of the aforementioned technology is that variable as possible implementation of the described digital/analogue converter requires for each feedback path a resistance, via which discharging occurs, as well as two capacitors which are charged to one of the two reference voltages respectively and of which, dependent on the actual digital modulator input clock signal, respectively output clock signal, one reference voltage is discharged over the resistance per cycle, which increases the number of components and thus the chip area required for production and thus creates additional costs.

The high signal peaks flowing on the integrator at the start of the discharge result in changing its input voltage behavior. In particular, the input common mode voltage changes abruptly before it can be adjusted back to its actual value by the so-called common mode feedback (CMFB). If this takes longer than the duration of a cycle or the common mode voltage varies for other reasons from one cycle to the next, for example due to modulation of the amplifier, the feedback signal also varies, because the current i flowing to the integrator follows the equation:

$$i = \frac{V_{Ref} - V_{CM}}{R} \cdot e^{\frac{t}{R \cdot C}}$$

$V_{Ref}$ is one of the reference voltages, $V_{CM}$ the amplifier common mode voltage, R the feedback resistance and C the feedback capacitor. It is readily evident that a variation of $V_{CM}$ changes the feedback signal. However, that means that, dependent on the duration of the cycle with the clock jitter, an error is introduced, which diminishes the resolution.

A further drawback of the described solution comes to light in so-called multibit realizations of the modulator, in which more than one bit is resolved inside the quantizer, increasing, on the one-hand, the stability and, on the other hand, the resolution of the modulator. However, this places high demands on the linearity of the digital/analogue converter in the feedback branch, which now must have the linearity of the entire system. Some realizations of this technology provide for a convenient layout by dividing the feedback elements into unit elements and statistically distributing these elements on the existent area in order to obtain equidistant digital/analogue converter steps. Moreover, there are prior art techniques that interconnect the unit sources quasi accidentally to the desired value in order to average out the error in this manner. One such technique, for example, is known under the term dynamic element matching. In all these techniques, with the hitherto solution of the clock jitter insensitive digital/analogue converter, one faces enormous problems, because two elements, resistance and capacitor, must be embedded with other unit elements of this type in the existent technology.

Based on this state of the art, the object of the present invention is to provide a device that permits the realization of a digital/analogue converter for a continuous-time sigma/delta modulator in which the continuous-time modulator shows less sensitivity to clock jitter. The aforementioned disadvantages should also be avoided with this digital/analogue converter.

SUMMARY OF THE INVENTION

The object of the present invention is achieved with the controlled current source described in claim 1. The claims 5, 7 and 11 describe a digital/analogue converter, a sigma/delta analog/digital converter and a method of operation, in which the proposed current source is utilized to reduce sensitivity to clock jitter.

The present controlled current source, in particular for digital/analogue converters in continuous time sigma/delta modulators, having a control input which generates an output current dependent on a control voltage applied to the control input, is provided with a controller for converting a clock signal into a voltage signal, with the controller being connected to the current source in such a manner that the voltage signal is applied as a control voltage to the control input of the current source. The controlled current source is distinguished by the controller being designed to convert the clock signal into a voltage signal which has within a clock duration a reproducible curve which ends with a falling flank.

In this controlled current source, the control voltage, which usually is the gate/base voltage of the current source, is not held constant over the entire clock period, but rather is reproducibly fed with a falling signal flank. This signal flank must limit the current within a clock cycle to sufficiently small values so that any premature or delayed switching-off due to clock jitter causes a sufficiently small error in a downstream application which requires provision of constant current packages independent of clock jitter.

In a preferred embodiment, to convert a digital signal into a current signal, the controlled current source is implemented in a digital/analogue converter, hereinafter referred to as current source digital/analogue converter. The digital signal is connected to the current source or to the controller. The error clock jitter causes in the integrator of a continuous-time sigma/delta modulator can be kept very small in this manner and consequently remains without any effect.

If such a type digital/analogue converter is used in the feedback branch of a sigma/delta modulator, the feedback signal, respectively the feedback current is directly generated by switching the current source on or off. This method is very insensitive to voltage fluctuations at the integrator input as the desired current from a current source is ideally supplied independent of the voltage applied thereto. Furthermore, current source digital/analogue converters can be implemented very well as multibit digital/analogue converters, because unit current sources, usually transistors, are employed. All the prior art linearization techniques can continue to be utilized. Moreover, using current source digital/analogue converters results in a reduction of the chip area required for fabrication, which saves production costs. Due to the generation of a control voltage for the current source by means of a voltage pulse, which reproducibly falls within the clock duration via a falling flank from a maximum value to a minimum value, the output current of the current source also has such a falling flank. In this manner, it is achieved that the error caused by improper switching of the system cycle due to clock jitter is sufficiently small. With favorable setting of the falling flank and of the minimum value, the influence of the error on the resolution of the sigma/delta modulator is negligible as the fluctuations only affect in the range of the minimum value and therefore do not cause any major deviations in an integration.

The proposed implementation of a digital/analogue converter equipped with a controlled current source according to the present invention in a sigma/delta modulator is very simple as usual perhaps even already implemented current source digital/analogue converters including all the linearization techniques, single bit and multibit, can be employed. For clock jitter insensitive implementation, the falling flank must only be reproducibly provided, in the ideal case only once for the entire modulator. The current pulse supplied by the current source is largely independent of the common-mode-input voltage ($V_{CM}$) of the integrator. Feedback due to the fluctuations $V_{CM}$ will, therefore only vary a little in the real implementation, which again results in improved jitter insensitivity.

In implementation of the sigma/delta modulator with Gm-C integrators, the current source can also be connected directly to the integration capacitors of the modulator, respectively to the Gm-C integrators, which then integrate the current up to the output voltage. The Gm cell to convert the input voltage signal into a proportional current is not burdened by the high feedback current pulse so that it only has to be provided with a conventional low slew rate and a small bandwidth.

Transistors which run in saturation operation are preferably utilized as the current source, respectively the current sources. In a MOS transistor, this saturation operation is realized by a drain-source voltage, which is greater than the effective gate-source voltage. The output current is largely independent of the drain-source voltage. The transistor is applied with the emitter (source) at the constant potential, the collector (drain) at the to-be-supplied node, in particular at the integration inputs of the modulator, and with the base (gate) at the control potential of the controller. The potential at the base in conjunction with the W/L ratio of the transistor sets the output current with the reproducible falling flank of the current source realized in this manner. In the present case, this potential is varied within a clock duration in such a manner that it falls from a maximum value to a minimum value.

Moreover, other circuits, which for example realize an improved current source with a higher inner resistance by means of a cascode transistor or in the form of a current source realization according to Wilson or Widlar, can of course also be employed. The essential feature of the present digital/analogue converter is not the actual current source but rather the controller which triggers the current source with the falling control voltage.

The controller can be realized in various ways. Any controller that supplies a reproducible voltage which either first rises and then reproducibly falls again to the initial value or that starts at a starting value and falls to an end value. The precondition is that the values in each clock phase within modulator resolution are the same and that the value applied as the control signal to the current source at the end of a clock phase generates a sufficiently low current in such a manner that a wrong switching time point of the clock results in a sufficiently small error.

An example of such a controller is a circuit comprising a capacitor C and a resistance R. The capacitor C is previously charged to the reference voltage and discharged over the resistance R to mass. The discharge voltage setting in is utilized as the control signal of the current source digital/analogue converter.

In a further embodiment of the controller, a so-called slope converter is employed to obtain a defined rising and falling flank of the current source control signal, which may also run linearly. Such a slope converter can, for example, be a resistance-capacitance integrator having a voltage source or a current source with a charge capacity. First, the clock signal is integrated to a reference voltage value on a capacitor. After switching of a comparator, deintegration to generate the falling flank occurs. Then, the integration capacity is discharged to zero. This procedure is repeated in the next clock phase.

BRIEF DESCRIPTION OF THE DRAWINGS

The present invention is made more apparent in the following using preferred embodiments with reference to the accompanying drawings.

WAYS TO CARRYING OUT THE INVENTION

Figure 1:
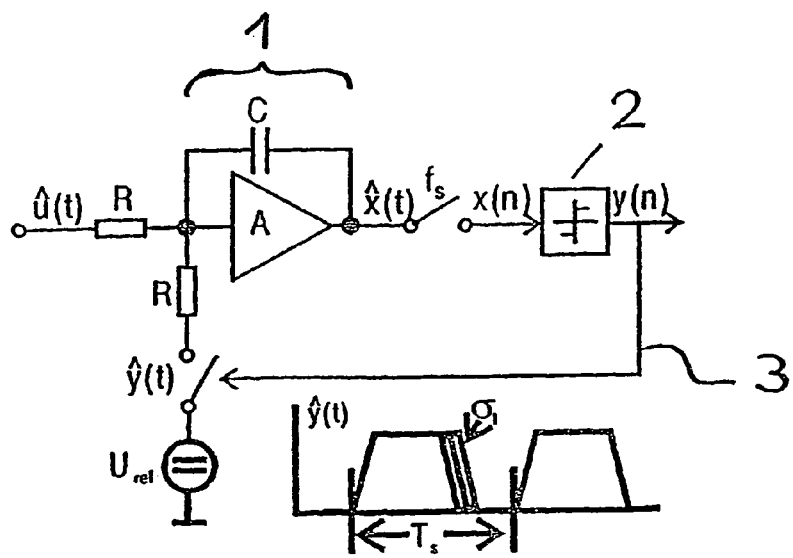
FIG. 1 shows an example of a state-of-the-art sigma/delta modulator.
Figure 2:
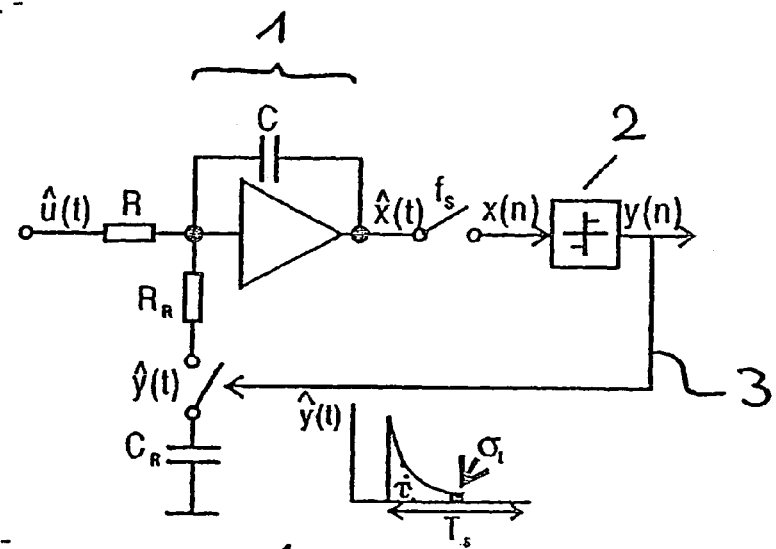
FIG. 2 shows another example of a state-of-the-art sigma/delta modulator, which is less sensitive to clock jitter.
Figure 3:
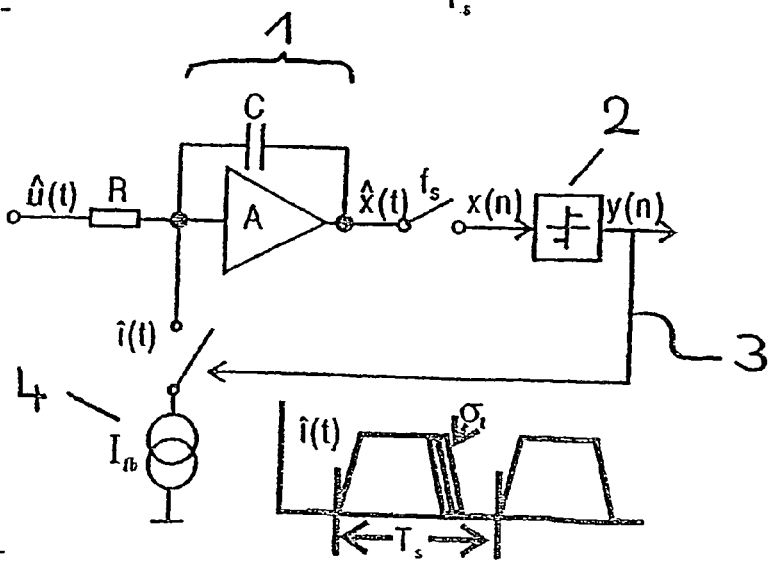
FIG. 3 shows an example of the realization of a sigma/delta modulator having a conventional state-of-the-art current source digital/analogue converter.

The embodiments of the known state-of-the-art sigma/delta modulators according to FIGS. 1 and 2 have already been described in detail in the introductory part of the summary of the invention. FIG. 3 shows the embodiment of a sigma/delta modulator in which the digital/analogue converter is provided with a current source 4 in the feedback branch. In this sigma/delta modulator as well, the input signal û(t) is superimposed via a resistance R at the input of the integrator 1 of the modulator with the feedback signal. The integrator 1 comprises here too an operating amplifier A and a capacitor C. The integrated output signal x̂(t) is sampled by means of a clock frequency $f_s$ and the sampling signal x(n) is conveyed to a quantizer 2, which delivers a digital output signal y(n). This digital output signal is fed back via the digital/analogue converter to the input of the modulator. In this manner, the current source 4 is switched on and off dependent on the digital signal y(n) which acts as a clock signal.

The bottom part of this figure shows the clocked output signal î(t) of the current source dependent on time. As can clearly be seen, fluctuation in the duration of the clock signal influences the length of the generated current pulse, which can lead to considerable errors in the subsequent integration in the modulator.

Figure 4:
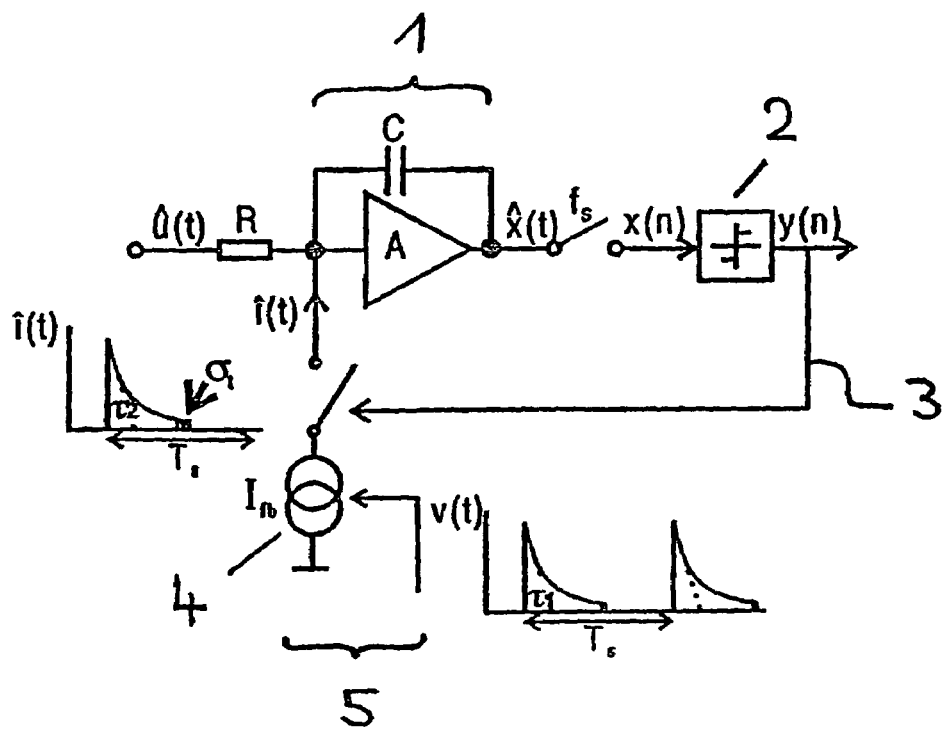
FIG. 4 shows an example of an embodiment of a sigma/delta modulator having a digital/analogue converter and a controlled current source according to the present invention.

Use of a digital/analogue converter having a controlled current source according to the present invention distinctly reduces this sensitivity to clock jitter. FIG. 4 shows an example of the embodiment of the present digital/analogue converter according to the present invention, in which the integrator 1 and the quantizer 2 of the sigma/delta modulator are realized in the same manner as in the embodiment of FIG. 3. In this case, a digital/analogue converter 5 designed according to the present invention is utilized only in the feedback branch 3. This digital/analogue converter 5, for its part, is also provided with a current source 4, which in the present case is triggered by a control voltage v(t), which has a certain predefined curve. The control voltage v(t), which is generated by a special device (not depicted in this figure) of the present digital/analogue converter 5, is shown schematically in the bottom right part of the figure. In this example, the control voltage v(t) quickly rises at the beginning of a clock duration $T_s$ to a maximum value and then falls with a defined falling flank to a minimum value. Triggering the current source 4 with this control voltage v(t) yields a current pulse î(t) as shown in the diagram in the left part of the figure. Essentially, this current pulse has the temporal course of the control voltage v(t). Due to this course of the current pulse, fluctuation in the clock duration affects only one part of the current pulse, in which the current already has reached a very low value. Integration over the current pulses as executed in the modulator, fluctuation in the clock duration does not or only insignificantly influences the result. As a consequence, at disposal is a continuous-time sigma/delta modulator that is insensitive to clock jitter.

Figure 5:
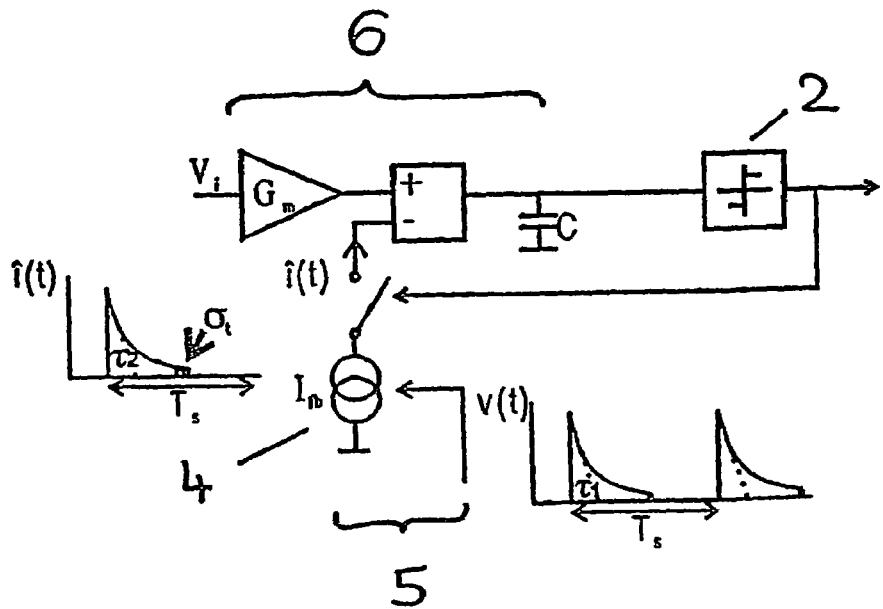
FIG. 5 shows a further example of an embodiment of a sigma/delta modulator having a digital/analogue converter and a controlled current source according to the present invention.

FIG. 5 shows another possibility of utilizing the present digital/analogue converter having a controlled current source in a continuous-time sigma/delta modulator. In this case, the integrator of the sigma/delta modulator is formed by a Gm-C integrator 6, which essentially is composed of a Gm cell and a capacitor connected to mass. In such an embodiment of the integrator of the sigma/delta modulator, the output signal, i.e. the output current pulse, of the invented digital/analogue converter can be applied directly to the capacitor C, via which the current then is integrated up to the output voltage. This embodiment has the advantage that the Gm cell does not need to be adapted to the feedback current pulse, i.e. does not need to have a greater bandwidth.

A sigma/delta modulator, as shown for example in FIGS. 1 to 5, in conjunction in a known manner with a downstream decimation filter yields a sigma/delta analogue/digital converter.

Figure 6:
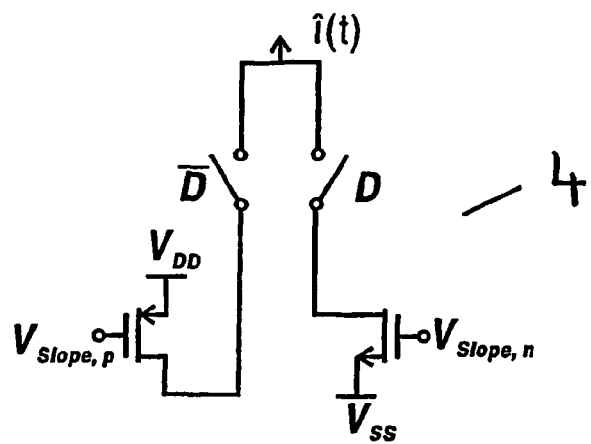
FIG. 6A and FIG. 6B show two examples of the design of the current source of the present digital/analogue converter.
Figure 6:
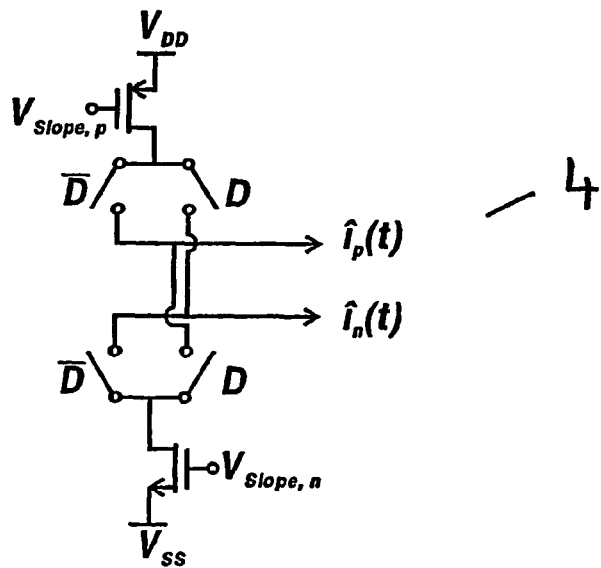

FIG. 6 shows two examples of a possible embodiment of the current source 4 of the present digital/analogue converter 5.

FIG. 6a) shows an exemplary implementation with MOS transistors. D is the digital modulator output and î the feedback current of the two preceding figures. $V_{slope,p}$ and $V_{slope,n}$ represent the voltage flanks of the control voltage v(t) formed according to the present invention which trigger the respective transistor current. The latter must be selected in such a manner that the feedback current is reduced sufficiently at the switch-off time point of the clock cycle so that clock jitter has no effect. Vss and Vdd are the operating voltages of the transistors or other reference voltages.

FIG. 6b) shows an exemplary implementation of the current source 4 of the digital/analogue converter 5 having MOS transistors for fully differential architecture. Thus, so-called fully differential amplifier/integrators/Gm cells are employed in which both a positive and a negative input and output are used for signal conveyance. The digital/analogue converter 5 can therefore be implemented in the shown circuit by means of suited switching of the current sources. In this case, $î_n(t)$ and $î_p(t)$ are the feedback currents on the corresponding input of the modulator. The other references have already been explained in the description of part a of the figure.

Figure 7:
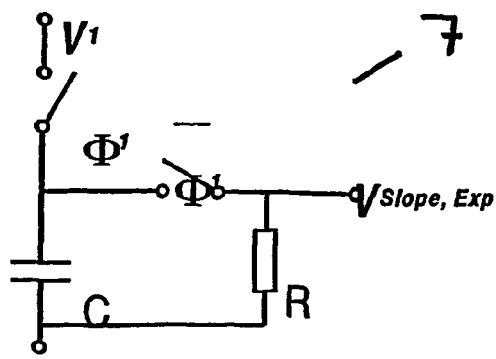
FIG. 7A, FIG. 7B and FIG. 7C show three examples of an embodiment of the controller for generating the control voltage in the present digital/analogue converter.
Figure 7:
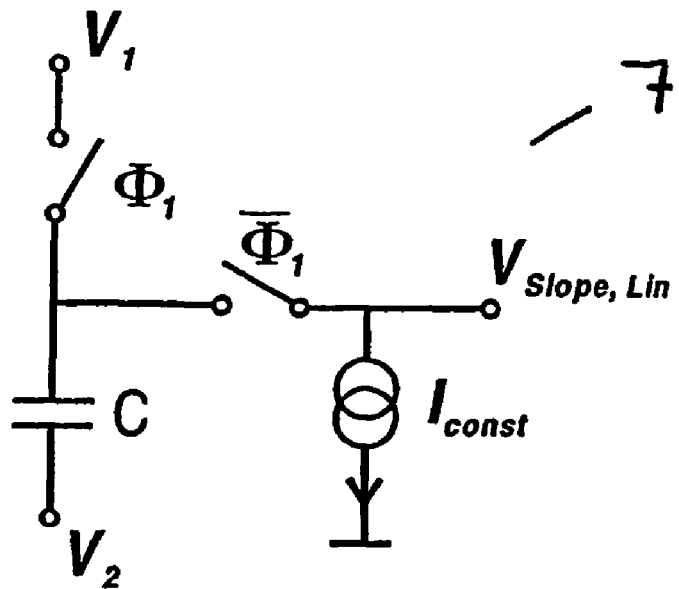
Figure 7:
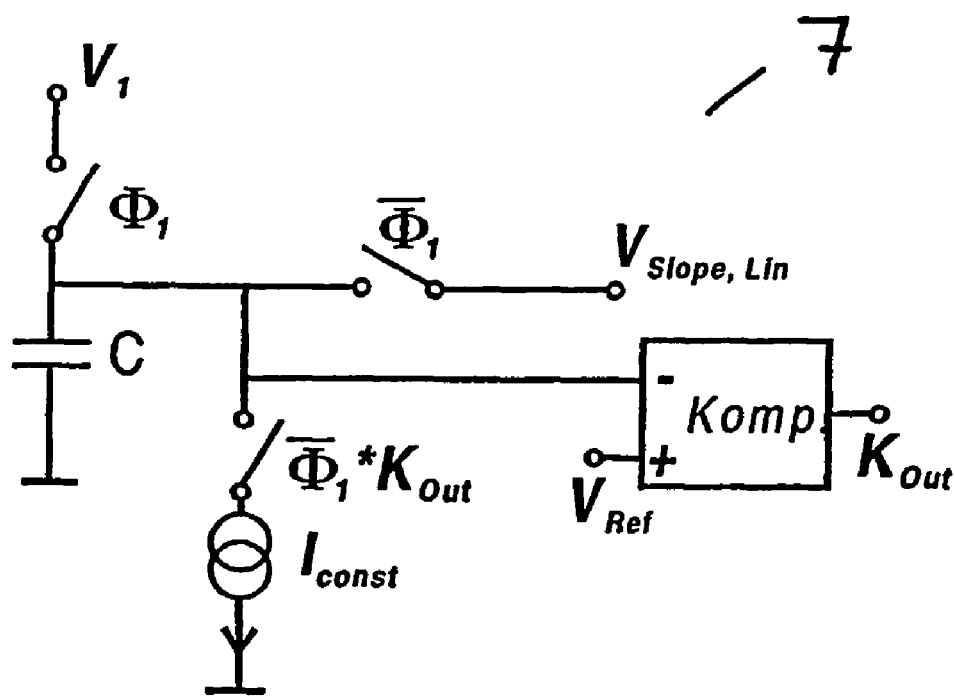

FIG. 7 shows three examples of a possible embodiment of the controller 7 for generating the control voltage in the present digital/analogue converter 5, respectively of the controlled current source.

FIG. 7a shows an exemplary implementation of the controller 7 for generating an exponential trigger voltage $V_{slope,Exp}(t)$ for the transistor current sources 4 by means of a resistance-capacitor circuit. $V_1$ and $V_2$ are the beginning voltage and the end voltage of the discharge step. $\phi_1$ is a clock signal so that the capacitor C is charged during the first clock phase and discharged during the second clock phase over the resistance R. This cycle can be the system cycle. Voltages $V_1$, and $V_2$ must be selected different for p-channel transistors and n-channel transistors (n: $V_1>V_2$, p: $V_1<V_2$). In this embodiment the temporal course of the output voltage is exponential.

FIG. 7b) shows an exemplary implementation of the controller 7 for generating a linear trigger voltage $V_{Slope,Lin}(t)$ for the transistor current sources 4. $V_1$ and $V_2$ are for their part the beginning voltage and the end voltage of the discharge step. $\phi_1$ is a clock signal so that the capacitor C is charged during the first clock phase and discharged during the second clock phase via the constant current source $I_{const}$. This cycle can be the system cycle. The voltages $V_1$ and $V_2$ and the current $I_{const}$ must be selected different for p-channel transistors and n-channel transistors. In this embodiment the temporal course of the output voltage is linear.

FIG. 7c) shows an exemplary implementation of the controller 7 for generating a linear trigger voltage $V_{Slope,Lin}(t)$ for the transistor current sources 4, in this case having a slope converter. $V_1$ is the beginning voltage of the discharge step. $\phi_1$ is a clock signal so that the capacitor C is charged during one clock phase and discharged during the second clock phase by the constant current source $I_{const}$. This cycle can be the system cycle. The discharge step is stopped as soon as the voltage over the capacitor C exceeds or falls under a certain value $V_{Ref}$. The voltages $V_1$ and $V_{Ref}$ and the current $I_{const}$ must be selected different for p-channel transistors and n-channel transistors. In this embodiment, too, the temporal course of the output voltage is linear.

In addition to these embodiments, other current sources and other devices familiar to someone skilled in the art which yield a corresponding temporal course of the control voltage v(t) dependent of a clock signal may, of course, also be utilized.

LIST OF REFERENCES 1 integrator
2 quantizer
3 feedback branch
4 current source
5 digital/analogue converter
6 Gm-C integrator
7 controller

The invention claimed is:

1. A controlled current source having a control input, in particular for digital/analogue converters in continuous-time sigma/delta modulators, which generates an output current dependent on a control voltage applied to said control input, and having a controller for converting a clock signal into a voltage signal, with said controller being connected to said current source in such a manner that said voltage signal is applied as a control voltage to said control input of said current source, wherein said controller is designed to convert said clock signal into a voltage signal which has within a clock duration a reproducible curve ending with a falling flank.

2. A controlled current source according to claim 1, wherein said controller comprises a capacitor and a resistance, which are connected in such a manner that said capacitor is discharged over said resistance to ground, with the voltage over said resistance corresponding to said voltage signal.

3. A controlled current source according to claim 1, wherein said controller comprises a slope converter.

4. A controlled current source according to claim 1, wherein said current source is formed by at least one transistor whose gate forms said control input.

5. A digital/analogue converter, in particular for continuous-time sigma/delta modulators, having a current source according to claim 1 for converting a digital signal into a current signal, with said digital signal being connected to said current source or said controller.

6. A digital/analogue converter according to claim 5 which is disposed in a feedback branch of a continuous-time sigma/delta modulator.

7. A sigma/delta analogue/digital converter having a sigma/delta modulator which receives a feedback signal via a feedback branch, wherein in said feedback branch, a digital/analogue converter according to claim 5 is disposed, whose output current forms said feedback signal.

8. A sigma/delta analogue/digital converter according to claim 7, wherein said sigma/delta modulator is a continuous-time sigma/delta modulator.

9. A sigma/delta analogue/digital converter according to claim 7, wherein said digital/analogue converter is connected to said sigma/delta modulator in such a manner that said feedback signal is applied to one integrator or a multiplicity of integrators of said sigma/delta modulator.

10. A sigma/delta analogue/digital converter according to claim 7, wherein said sigma/delta modulator is provided with a Gm-C integrator and said digital/analogue converter is connected to said sigma/delta modulator in such a manner that said feedback signal is directly applied to a capacitor of said Gm-C integrator.

11. A method of operating a sigma/delta analogue/digital converter having a continuous time sigma/delta modulator, in which a feedback signal is generated for said sigma/delta modulator by switching on and off dependent on a clock signal of said sigma/delta modulator a current source, which supplies an output current dependent on a control voltage, wherein said control voltage of said current source is selected in such a manner that it has within each clock duration a reproducible curve which ends with a falling flank.

12. A method according to claim 11, wherein said output current is directly applied to an input of an integrator of said sigma/delta modulator.

13. A method according to claim 11, wherein if utilizing a Gm-C integrator in said sigma/delta modulator, said output current is directly applied to a capacitor of said Gm-C integrator.

14. A method according to claim 11, wherein a transistor circuit is utilized as said current source.

15. A method according to claim 11, wherein said control voltage of said current source is generated via a resistance-capacitance module.

16. A method according to claim 11, wherein said control voltage of said current source is generated via a slope converter.

* * * * *